United States Patent [19]
Naito et al.

[11] Patent Number: 5,334,799
[45] Date of Patent: * Aug. 2, 1994

[54] WATERTIGHT CASING FOR ELECTRONIC APPARATUS

[75] Inventors: Yoshihisa Naito, Kawasaki; Takahiro Hayashi, Yokohama, both of Japan

[73] Assignee: Matsushita Electric Industrial Co., Ltd., Osaka, Japan

[*] Notice: The portion of the term of this patent subsequent to Aug. 24, 2010 has been disclaimed.

[21] Appl. No.: 884,165

[22] Filed: May 18, 1992

[30] Foreign Application Priority Data

May 24, 1991 [JP] Japan ................... 3-120483

[51] Int. Cl.⁵ .............................. H05K 5/06
[52] U.S. Cl. .................... 174/17 VA; 174/52.1; 361/736
[58] Field of Search ............ 174/17 VA, 52.1, 52.3, 174/52.4; 361/392, 394, 395, 399, 736; 206/328, 333, 334

[56] References Cited

U.S. PATENT DOCUMENTS

| | | | |
|---|---|---|---|
| 3,784,725 | 1/1974 | Perkins et al. | 174/52.1 |
| 3,863,436 | 2/1975 | Schwarzschild et al. | 174/52.1 |
| 5,081,327 | 1/1992 | Graham et al. | 174/17 VA X |
| 5,239,446 | 8/1993 | Matsumura et al. | 174/52.3 X |

FOREIGN PATENT DOCUMENTS

| | | |
|---|---|---|
| 56-15568 | 2/1981 | Japan . |
| 62-21991 | 1/1987 | Japan . |
| 220742 | 5/1968 | Sweden ............. 174/17 VA |
| 2013965 | 8/1979 | United Kingdom . |

Primary Examiner—Timothy V. Eley
Assistant Examiner—Khan V. Nguyen
Attorney, Agent, or Firm—Stevens, Davis, Miller & Mosher

[57] ABSTRACT

A watertight casing for electronic apparatus includes a first case, a second case and a cover. Sealing members are interposed between the first case and the second case, and between the second case and the cover, respectively. The first and the second cases and the cover are fastened tightly together. A printed board mounts electronic parts on one side thereof, and an air-zinc battery on the other side. The first case is provided with a recess portion into which the electronic parts on the printed board are received. Another sealing member is interposed between the second case and the other side of the printed board. The second case is provided with a through hole which is closed by the cover. The battery is received in the through hole in a sealed manner. The second case is further provided with a vent hole communicating the through hole with an atmosphere. At the opening end of the vent hole there is provided with a gas permeable waterproof sheet for permitting air to pass through but not permitting moisture to pass through.

3 Claims, 2 Drawing Sheets

WATERTIGHT CASING FOR ELECTRONIC APPARATUS

BACKGROUND OF THE INVENTION

The present invention relates to a casing having a watertight structure which is available for portable electronic apparatus or the like, which uses a battery requiring gas permeance, such as an air-zinc battery.

In a conventional casing of this type, a cup-shaped case houses therein electronic parts. A cover is attached to the case through a sealing member interposed therebetween so as to close an opening of the case, thereby defining a watertight casing. The sealing member prevents moisture contained in the atmosphere from penetrating into an interior of the casing.

The casing is encountered with a problem that it is impossible to incorporate therein a battery requiring gas permeance, e.g. an air-zinc battery since the casing is sealed to prevent permeance of air.

SUMMARY OF THE INVENTION

An object of the present invention is to provide a casing which can overcome the above-mentioned problem of the conventional art. More specifically, it is an object to provide a casing which can prevent moisture from penetrating into an interior of a casing, but permit gas permeance for the incorporated battery. Namely, the present invention has an object to provide a casing capable of incorporating therein a battery, such as an air-zinc battery which needs air introduce from the outside or a battery, such as a lead storage battery which needs to release gas generated outside.

To this end, the present invention provides a casing which comprises a case incorporating therein a battery and having a vent hole communicating an interior or the case with an atmosphere, a cover attached to the case so as to define a watertight casing, and a gas permeable waterproof sheet provided for closing the vent hole.

According to the present invention, since air is freely introduced into and released from the interior of the casing through the vent hole and the gas permeable sheet, it is possible to incorporate an air-zinc battery or the like. Further, since moisture is prevented from penetrating into the interior of the casing by means of the gas permeable waterproof sheet provided on the vent hole, the casing has a watertight structure.

DETAILED DESCRIPTION OF THE PREFERRED EMBODIMENTS

Figure 1:
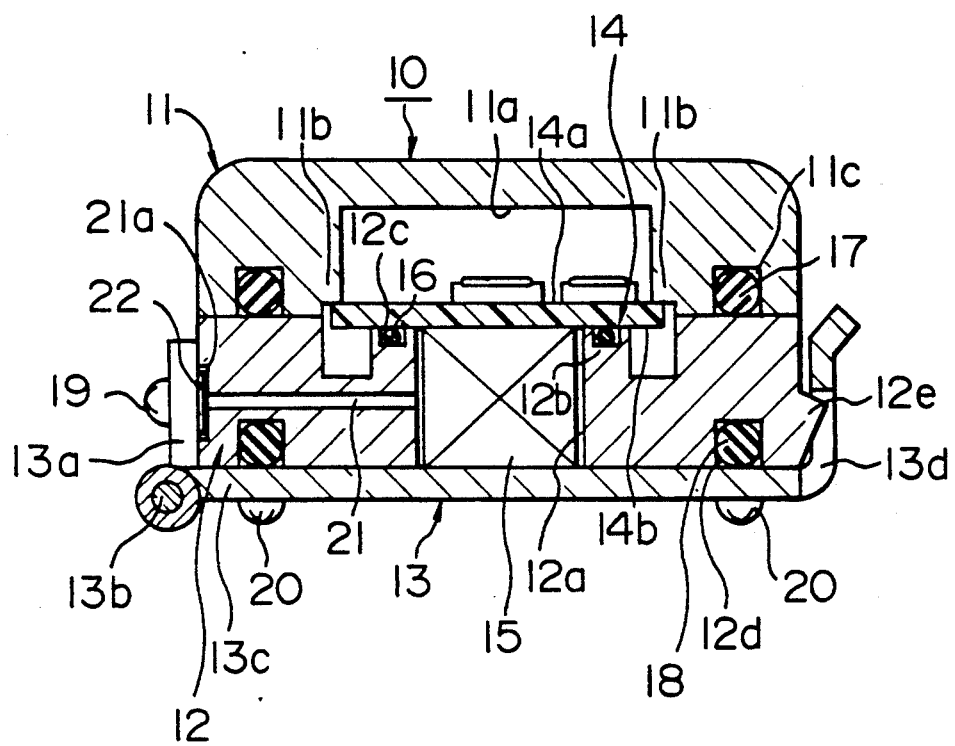
FIG. 1 is a sectional view showing a casing according to one embodiment of the present invention.

Referring to FIG. 1, a casing 10 includes a first case 11, a second case 12, and a pivotal cover 13. The casing 10 further includes a printed board 14, on one side 14a of which electronic parts are mounted and on the other side 14b of which an air-zinc battery 15 for driving the printed board 14 is provided.

The first case 11 is provided with a recess portion 11a. The second case 12 is provided with a through hole 12a for the battery 15 and an annular land portion 12b around the through hole 12a. The printed board 14 is fixed by means of a stepped portion 11b of the first case 11 and seated on the land portion 12b through a sealing member 16 disposed within a groove 12c formed therein so that the air-zinc battery 15 is received in the through hole 12a of the second case 12.

Between the cases 11 and 12 a sealing member 17 is interposed, which is disposed within an annular groove 11c formed in the first case 11. A sealing member 18 is interposed between the second case 12 and the cover 13, which is disposed within an annular groove 12d formed in the second case 12.

The first and the second cases 11 and 12 are fastened tightly together by means of screws (not shown). The sealing members 16 and 17 are watertightly press-fitted against contact surfaces of the printed board and the second case due to the fastening forces of the screws.

Figure 1A:
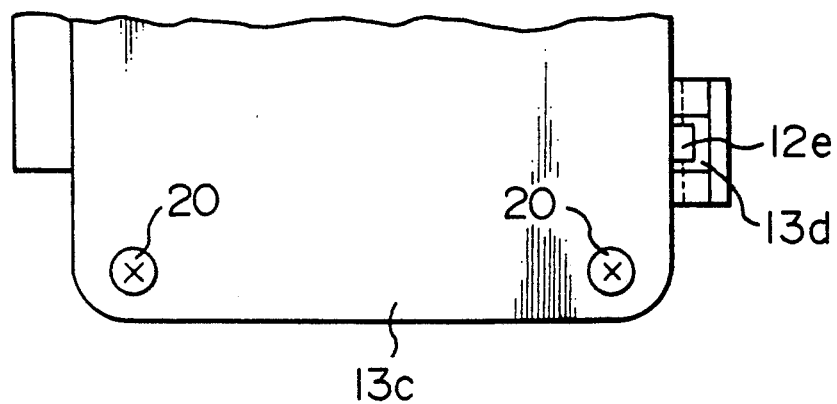
FIG. 1A is a fragmentary bottom view of the casing shown in FIG. 1.

The cover 13 includes a fastening portion 13a secured to the second case 12 by means of screws 19, a hinge pin 13b, and a main body 13c pivotally mounted on the hinge pin 13b. At free end portion of the main body 13c of the cover 13 there are provided with upright portions. Each of upright portions is provided with an opening 13d which is engageable with a projection 12e formed on the second case 12 to snap the main body 13c down. According this, the through hole 12a of the second case 12 is closed by the main body 13c of the cover 13. In order to obtain a watertightness between the second case 12 and the cover 13, the main body 13c is fastened through the sealing member 18 onto the second case 12 by means of screws 20 (FIG. 1A).

The second case 12 is further provided with a vent hole 21 communicating the through hole 12a with an atmosphere. At an enlarged recessed end 21a of the vent hole 21 a gas permeable waterproof sheet 22 is attached thereto. The sheet 22 has a multiplicity of fine pores which permit air to permeate the sheet 22 but not permit moisture to permeate it.

An assembling operation of this casing will be described hereinafter.

At first, the printed board 14 is inserted into the recess portion 11a of the first case 11 with facing the electronic parts mounting side 14a towards the recess portion 16, so as to abut against the stepped portion 11b. The sealing members 17 and 16 are fitted into the groove 11c of the first case 11 and the groove 12c in the land portion 12b of the second case 12. The first case 11 and the second case 12 are put together so that the air-zinc buttery 15 is received in the through hole 12a of the second case 12, and then fastened together by the screws (not shown).

The gas permeable waterproof sheet 22 is adhered to the enlarged recessed end 21a of the vent hole 21. The cover 13 is fixed at the fastening portion 13a thereof secured to the second case 12 by means of screws 19. The sealing member 18 is fitted into the annular groove 12d of the second case 12. The main body 13c of the cover 13 is pivoted on the hinge pin 13b so as to latch a periphery of the opening 13d on the projection 12e, thereby closing an opening of the through hole 12a of the second case 12. The main body 13c is fastened to the second case 12 by means of the screws 20.

In the casing 10 thus constructed, the recess portion 11a of the first case 11 incorporating the electronic parts on the printed board 14 is sealed by means of the sealing members 16 and 17. Therefore, the electronic parts are protected from moisture. The through hole 12a incorporating the air-zinc battery 15 is sealed by means of the sealing member 18 and the waterproof sheet 22. Therefore, the air-zinc battery 15 is also protected from moisture. Further, since the gas permeable waterproof sheet 22 permits air to pass through it, but not moisture, it can be possible to introduce air into the through hole 12a through the vent hole 21 so as to supply air from the outside to the air-zinc battery 15.

Further, even though the main body 13c of the cover 13 is snapped out for replacing the air-zinc battery 15 with a new one, the recess portion 11a of the first case 11 is still maintained under watertight condition. Specifically, the seal between the second case 12 and the printed board 14 is conducted by the sealing member 16, and the seal between the first case 11 and the second case 12 is conducted by the sealing member 17. Therefore, it can be possible to prevent moisture from penetrating into the recess portion 11a, thereby protecting the electronic parts from the moisture.

Figure 2:
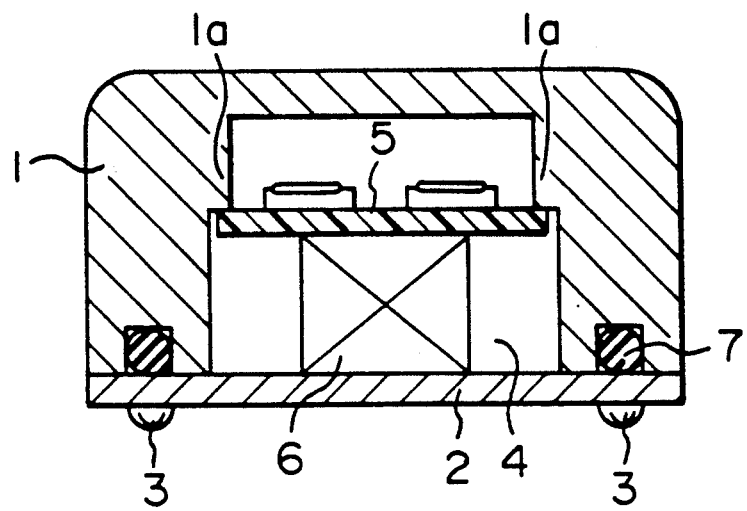
FIG. 2 is a sectional view showing a conventional casing.
Figure 2A:
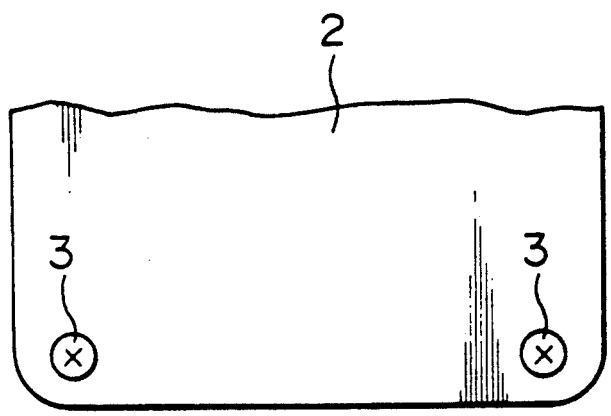
FIG. 2A is a fragmentary bottom view of the casing shown in FIG. 2.

To the contrary, as shown in FIGS. 2 and 2A, a conventional casing includes a single cup-shaped case 1 and a cover 2. The cover 2 is detachably screw-mounted to the case 1 by means of screws 3 so as to define therebetween a space 4 for a printed board 5. The printed board 5 mounting electronic parts and a battery 6 is disposed within the printed board space 4 and rested on stepped portion 1a of the case 1. A seal between the case 1 and the cover 2 is conducted only by a sealing member 7. If the cover 2 is detached to replace the battery 6 with a new one, moisture contained in the atmosphere enters into the printed board space 4 to deteriorate the electronic parts. Further, to the contrary, since the printed board space 4 is watertightly sealed, if an air-zinc battery is used for driving the printed board, it is very difficult to supply air to the air-zinc battery. Therefore, the air-zinc battery cannot work very well.

According to the above-mentioned embodiment of the present invention, since the cover 13 is secured at the fastening portion 13a thereof to the second case 12 by means of screws 19, if the main body 13c is snapped off for the replacement of the battery, it can be prevented to lose or drop it out. Further, on re-mounting of the main body 13c it can be readily screw-mounted to the second case 12. Moreover, the gas permeable waterproof sheet 22 is adhered to the enlarged recessed end 21a of the vent hole 21, thereby not marring up an outward appearance of the casing 10.

Further, according to the present invention, a gas generation battery such as lead storage battery can be incorporated in the casing. Namely, since the gas generated from a battery can be exhausted outside through the vent hole 21 and the gas permeable sheet 22, the gas generation battery can be used for driving the printed board without deteriorating the battery performance.

What is claimed is:

1. A watertight casing for an electronic apparatus including a printed board having a battery mounted on one side thereof and electronic parts mounted on the other side thereof, said casing comprising:
   a first case provided with a recess portion for receiving said electronic parts on said printed board;
   a second case attached to said first case and provided with a through hole for receiving said battery and a land portion surrounding said through hole;
   a cover member attached to said second case;
   a first sealing member interposed between said first case and said second case;
   a second sealing member interposed between said second case and said cover member; and
   a third sealing member positioned so as to be interposed, when said electronic apparatus is housed within said casing, between said printed board and said land portion of said second case;
   a vent hole provided in said second case for communicating said through hole with an atmosphere; and
   a gas permeable waterproof sheet for closing said vent hole.

2. A watertight casing according to claim 1, wherein said battery is an air-zinc battery.

3. A watertight casing according to claim 1, wherein said cover is pivotally mounted onto said second case.

* * * * *